United States Patent
Yamashita et al.

(10) Patent No.: US 8,419,911 B2
(45) Date of Patent: Apr. 16, 2013

(54) DEPOSITION METHOD BY PHYSICAL VAPOR DEPOSITION AND TARGET FOR DEPOSITION PROCESSING BY PHYSICAL VAPOR DEPOSITION

(75) Inventors: Hideki Yamashita, Mino (JP); Takafumi Okuma, Hirakata (JP); Hiroshi Hayata, Hirakata (JP); Hitoshi Yamanishi, Higashiosaka (JP); Tadashi Kimura, Kobe (JP); Hirokazu Nakaue, Daito (JP)

(73) Assignee: Panasonic Corporation, Osaka (JP)

(*) Notice: Subject to any disclaimer, the term of this patent is extended or adjusted under 35 U.S.C. 154(b) by 2135 days.

(21) Appl. No.: 11/339,506

(22) Filed: Jan. 26, 2006

(65) Prior Publication Data

US 2006/0272936 A1    Dec. 7, 2006

(30) Foreign Application Priority Data

Jan. 28, 2005  (JP) ................................ 2005-020704
Jun. 7, 2005   (JP) ................................ 2005-166486
Oct. 26, 2005  (JP) ................................ 2005-310746

(51) Int. Cl.
  *C23C 14/06* (2006.01)

(52) U.S. Cl.
  USPC ............ 204/298.12; 204/192.12; 204/192.13; 204/298.13

(58) Field of Classification Search ............. 204/192.12, 204/192.13, 298.12, 298.13
See application file for complete search history.

(56) References Cited

U.S. PATENT DOCUMENTS

| | | | |
|---|---|---|---|
| 5,118,661 A | * | 6/1992 | Maeda ........................... 505/511 |
| 2003/0077199 A1 | * | 4/2003 | Sandlin et al. ..................... 419/8 |
| 2006/0021870 A1 | * | 2/2006 | Tsai et al. ................ 204/192.13 |

FOREIGN PATENT DOCUMENTS

| | | | |
|---|---|---|---|
| JP | 60121269 A | * | 6/1985 |
| JP | 2-85360 | | 3/1990 |
| JP | 5-65642 | | 3/1993 |
| JP | 9-176845 | | 7/1997 |
| JP | 10-36962 | | 2/1998 |
| JP | 11-193457 | | 7/1999 |
| JP | 2004006221 A | * | 1/2004 |
| JP | 2005-29859 | | 2/2005 |
| KR | 2001-0028341 | | 4/2001 |

OTHER PUBLICATIONS

Machine Translation of JP2004006221A by Abe. Jan. 2004.*

* cited by examiner

*Primary Examiner* — Keith D. Hendricks
*Assistant Examiner* — Jason M Berman
(74) *Attorney, Agent, or Firm* — Wenderoth, Lind & Ponack, L.L.P.

(57) ABSTRACT

A deposition apparatus includes a processing chamber internally having a reduced-pressure space for deposition process to be carried out therein, a base material holding member for holding a base material to be subjected to the deposition process, a target support member for supporting a target thereon, and a power supply unit for applying electric power to the target support member to generate a plasma in the reduced-pressure space. In the deposition apparatus, deposition process is carried out by using the target, which has a recess portion in its surface and in which a powder target formed of a powder material is placed in an inner surface of the recess portion. Thus, the in-plane uniformity of deposition rate is improved and a stable film deposition is fulfilled.

20 Claims, 10 Drawing Sheets

DEPOSITION METHOD BY PHYSICAL VAPOR DEPOSITION AND TARGET FOR DEPOSITION PROCESSING BY PHYSICAL VAPOR DEPOSITION

TECHNICAL FIELD

The present invention relates to film deposition to be used in manufacture of various devices including physical vapor deposition processing. More particularly, the invention relates to a deposition method by PVD process, "physical vapor deposition processing", using a target made of powder material, as well as to a deposition target for use in PVD process.

BACKGROUND ART

In recent years, semiconductors or other electronic devices have been in a rapid progress toward scale-down, necessitating high-precision processing. Among such fine processing techniques, a common one is deposition methods using a sputtering process, in particular, for a thin film formation process. The sputtering process is a process that with a plasma generated by making gas discharge occurring in a vacuum atmosphere, cations of the plasma are allowed to collide with a target (or sputtering target) placed at a negative electrode which is a so called sputtering electrode so that particles sputtered by the collisions adhere to a substrate to be processed, by which a thin film is formed.

Such sputtering processes are widely used in deposition processes by virtue of their easiness in composition control or device operability. Whereas the target in a deposition process is in many cases a plate-shaped one, it is unlikely that the target surface is uniformly depleted. This poses an issue that the use efficiency of the target material degrades. To solve this issue, in recent years, there have been penetrating techniques using powdery or granular targets such as shown in FIGS. 10 and 11 (see, e.g., Document 1: Japanese unexamined patent publication No. H09-176845 A, and Document 2: Japanese unexamined patent publication No. H10-036962 A).

In a sputtering apparatus 500 shown in FIG. 10, a granular target material 502 is set within a target mounting plate 501 placed within a processing chamber 508. Then, with electric power applied from an RF-power supply 510 through a matching box 511, plasma is generated in the processing chamber 508, by which deposition processing by sputtering is carried out.

In a sputtering apparatus 600 shown in FIG. 11, vibrations are imparted to a target mounting plate 601 by a vibration generator 609 so that planarization of a granular target 602 that has been nonuniformly depleted after the sputtering process can be achieved.

Further, there have been provided a reactive sputtering apparatus, as shown in FIG. 12, in which a plate-like target 702 having a plurality of small holes 702a is set on a target mounting base 701 having small holes intended for use of gas introduction, in which state sputtering is carried out (see, e.g., Document 3: Japanese unexamined patent publication No. H05-065642 A), and another apparatus, as shown in FIGS. 13A and 13B, which is intended for use of a complex target in which embedment objects 803 made of different-composition ingredients are embedded in a plurality of hole portions provided in a target plate 802 (see, e.g., Document 4: Japanese unexamined patent publication No. H02-085360 A).

DISCLOSURE OF THE INVENTION

However, with the use of the method described in Document 1 or Document 2 that a powdery or granular target is generally planarized, because of the target material being powdery or granular, it is difficult to control the state of occurrence of irregularities to achieve a perfect planarization. In deposition processing, red-heated portions occurring to the target depend on the state of occurrence of irregularities on the target surface. Therefore, if the state of occurrence of irregularities cannot be controlled, places of occurrence of the red-heated portions also cannot be controlled so that the red-heated portions would occur at nonuniform places. Such red-heated portions are places in the target surface which are of high energy and also places which largely affect the deposition processing by sputtering. Therefore, if the places where the red-heated portions occur are nonuniform in the target, it is difficult to control the deposition rate, resulting in instability of the deposition rate.

Moreover, with the target described in Document 3 Document 4 as well, it is difficult to control the places of occurrence of the red-heated portions, resulting in occurrence of the red-heated portions at nonuniform places.

Accordingly, an object of the present invention is to solve these and other issues and provide a deposition method by PVD, as well as a deposition target for deposition processing by PVD, which is capable of reliably controlling sputtering regions for deposition processing in a target containing a powdery target so that in-plane uniformity of the deposition rate is improved, thus making it possible to achieve a stable deposition.

In order to achieve the above object, the present invention has the following constitutions.

According to a first aspect of the present invention, there is provided a deposition method by PVD, a comprising:

in a processing chamber, applying electric power to a target, the target having a recess portion which has a depth of 1 mm or more and in which a surface thereof is formed of a powder material, so that a plasma is generated within the processing chamber; and generating sputter particles from the target by the plasma, thereby the sputter particles form a deposition film onto a base material.

According to a second aspect of the present invention, there is provided the deposition method by PVD as defined in the first aspect, wherein the recess portion in the target is formed so that an angle formed by an inside surface of the recess portion and the target surface is not less than 90 degrees and less than 180 degrees.

According to a third aspect of the present invention, there is provided the deposition method by PVD as defined in the first aspect, wherein if the powder material has a heat conductivity λ, a stabilization time t, a specific heat Cp, a powder density ρ, and a depth L of the recess portion, then a Fourier number defined by $((\lambda \cdot t)/(Cp \cdot \rho \cdot L^2))$ satisfies Equation (1).

$$3.5 \times e^{+03} \leq \lambda \cdot t / Cp \cdot \rho \cdot L^2 \leq 2.0 \times e^{+04} \tag{1}$$

According to a fourth aspect of the present invention, there is provided the deposition method by PVD as defined in the first aspect, wherein if the powder material has a particle size D, a powder density ρ, and a specific surface area S, then Equation (2) is satisfied.

$$01 \leq D \cdot \rho \cdot S \leq 10 \tag{2}$$

According to a fifth aspect of the present invention, there is provided the deposition method by PVD as defined in the first aspect, wherein a width of the recess portion in the target is not more than 20 mm.

According to a sixth aspect of the present invention, there is provided the deposition method by PVD as defined in the first aspect, wherein one or a plurality of the recess portions are placed in point symmetry with respect to a center of the target.

According to a seventh aspect of the present invention, there is provided the deposition method by PVD as defined in the first aspect, wherein the powder material has a particle size of not more than 1 μm.

According to an eighth aspect of the present invention, there is provided a deposition target for use in PVD, comprising a target surface having a recess portion which has a depth of not less than 1 mm and in which an inner surface thereof is formed of a target made by powder material.

According to a ninth aspect of the present invention, there is provided the deposition target for use in PVD as defined in the eighth aspect, wherein the recess portion in the target is formed so that an angle formed by an inside surface of the recess portion and the target surface is not less than 90 degrees and less than 180 degrees.

According to a tenth aspect of the present invention, there is provided the deposition target for use in PVD as defined in the eighth aspect, wherein the recess portion is so formed that the angle is 120 degrees.

According to an eleventh aspect of the present invention, there is provided the deposition target for use in PVD as defined in the eighth aspect, wherein a width of the recess portion in the target is not more than 20 mm.

According to a twelfth aspect of the present invention, there is provided the deposition target for use in PVD as defined in the eighth aspect, wherein the powder material has a particle size of not more than 1 μm.

According to a thirteenth aspect of the present invention, there is provided the deposition target for use in PVD as defined in the eighth aspect, further comprising a sintered body target in which a recess-shaped or through hole-shaped powder-material placement portion where the target made by powder material is to be placed is formed, wherein the target made by powder material is placed in the powder-material placement portion so that the recess portion is formed by the target made by powder material.

According to a fourteenth aspect of the present invention, there is provided the deposition target for use in PVD as defined in the thirteenth aspect, wherein the sintered body target has a same composition to the target made by powder material.

According to a fifteenth aspect of the present invention, there is provided the deposition target for use in PVD as defined in the eighteenth aspect, wherein the target made by powder material is made up by mixing together two or more kinds of powder materials different from each other.

According to a sixteenth aspect of the present invention, there is provided the deposition target for use in PVD as defined in the eighth aspect, wherein the powder material contains typical metal elements or transition metal elements, or oxides thereof, fluorides, nitrides, sulfides, hydroxides or carbonates of the metal elements thereof.

According to a seventeenth aspect of the present invention, there is provided the deposition target for use in PVD as defined in the eighth aspect, wherein the powder material has a particle size of not more than 1 μm.

According to an eighteenth aspect of the present invention, there is provided the deposition target for use in PVD as defined in the eighth aspect, wherein if the powder material has a heat conductivity λ, a stabilization time t, a specific heat Cp, a powder density ρ, and a depth L of the recess portion, then a Fourier number defined by $((\lambda \cdot t)/(Cp \cdot \rho \cdot L^2))$ satisfies Equation (3).

$$3.5 \times e^{+03} \leq \lambda \cdot t / Cp \cdot \rho \cdot L^2 \leq 2.0 \times e^{+04} \quad (3)$$

According to a nineteenth aspect of the present invention, there is provided the deposition target for use in PVD as defined in the eighth aspect, wherein if the powder material has a particle size D, a powder density ρ, and a specific surface area S, then Equation (4) is satisfied.

$$0.1 \leq D \cdot \rho \cdot S \leq 10 \quad (4)$$

According to a twentieth aspect of the present invention, there is provided the deposition target for use in PVD as defined in the eighth aspect, wherein one or a plurality of the recess portions are placed in point symmetry with respect to a center of the target.

According to the present invention, it becomes implementable to improve the deposition rate and the in-plane uniformity of the target and to ensure mass production stability of film deposition.

BRIEF DESCRIPTION OF THE DRAWINGS

These and other aspects and features of the present invention will become clear from the following description taken in conjunction with the preferred embodiments thereof with reference to the accompanying drawings, in which:

FIG. 5A is a view showing a state that an edge portion of a recess portion is red-heated, FIG. 5B is a view showing a state that the red-heating is expanded to the slope surface of the recess portion, FIG. 5C is a view showing a state that the red-heating is further expanded in the recess portion, and FIG. 5D is a view showing a state that the red-heated portion is formed all over the recess portion;

DETAILED DESCRIPTION OF THE INVENTION

Figure 1:
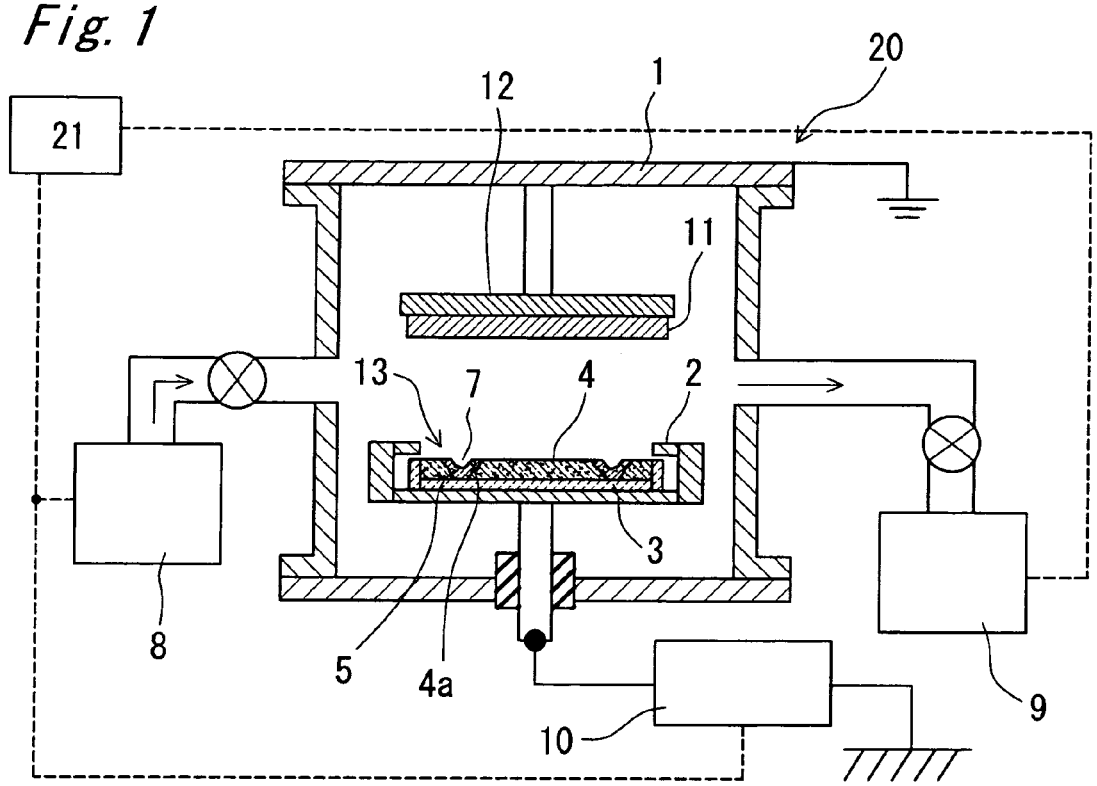
FIG. 1 is a schematic configurational view showing the configuration of a deposition apparatus according to a first embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

(First Embodiment)

FIG. 1 shows a schematic configurational view showing the configuration of a deposition apparatus (sputtering apparatus) 20 which is an example of the deposition apparatus by a sputtering process which is an example of the physical vapor deposition method according to a first embodiment of the present invention.

As shown in FIG. 1, the deposition apparatus 20 includes a vacuum chamber 1 which is an example of a processing chamber internally having a reduced-pressure space, e.g. vacuum atmosphere, for deposition process by sputtering to be carried out therein, a grounding shield 2 placed close to a sintered body target in the later-described target (or sputtering target), a target mounting plate 3 which is an example of a target support member on which the target is to be mounted within the vacuum chamber 1, and a base material holding member 12 which is an example of a member for holding a base material (material to be processed) 11 which is to be subjected to deposition processing in the vacuum chamber 1. Also, a target 13 to be mounted on the target mounting plate 3 comprises a sintered body target 4 which is formed into a disc shape as an example and in which a groove portion 4a serving as a groove-shaped through hole is formed in its surface, and a powder target 5 which is placed in an inner surface of the groove portion 4a and which is formed of a powder material forming a recess portion 7. The recess portion 7 is formed, before performing the deposition process, by pressurizing or removing the powder target 5 in a line shape (or recess shape) by means of a member for formation of the recess portion. As a result of this, line-shaped (or groove-shaped) recess portion 7 is formed. In the case where the powder target 5 is partly pressurized to form the recess portion 7, it is considered that the density of the powder target 5 around the recess portion 7 becomes larger than that of other locations because of the pressurization. In such a manner that the recess portion 7 formed in this way faces the base material 11 held on the base material holding member 12, the target 13 is mounted on the target mounting plate 3. The powder target 5 like this is, for example, a target material formed by mixing together two or more kinds of different powder materials or granular materials. The deposition apparatus 20 further includes a gas introduction unit 8 for introducing gas for use of plasma generation in the vacuum chamber 1, a gas evacuation unit 9 for discharging the gas in the vacuum chamber 1 to form a vacuum atmosphere, and a power supply unit 10 for applying electric power to the target mounting plate 3 so as to generate a plasma in the space above the target 13. The deposition apparatus 20 still further includes a control unit 21 for controlling the power supply unit 10, the gas introduction unit 8 and the gas evacuation unit 9 during the deposition process. In a case where the evacuation is performed with the recess portion 7 already formed in the target 13, it is necessary to perform the evacuation so slowly that the recess portion 7 is not deformed. This is because rapid evacuation could cause the powder target 5, which forms the recess portion 7, to be also affected by a pressure change due to the evacuation, making the recess portion 7 deformed.

Now the structure of the target 13 provided in this case is explained with reference to the schematic sectional view of the target 13 shown in FIG. 2. It is noted that FIG. 2 is a schematic enlarged sectional view of the target 13 mounted to the target mounting plate 3 in the deposition apparatus 20 of FIG. 1.

Figure 2:
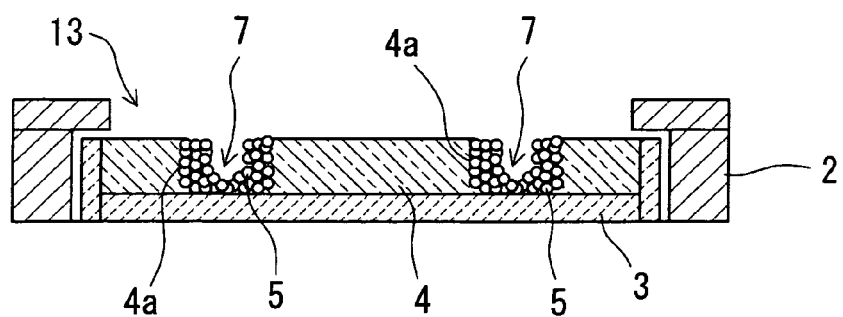
FIG. 2 is a schematic sectional view showing the structure of a target to be set on the deposition apparatus of FIG. 1.

As shown in FIG. 2, the sintered body target 4 is mounted on top of the target mounting plate 3, and the groove portion 4a is made up by the groove-shaped through hole formed in the sintered body target 4 and the top face of the target mounting plate 3. The powder target 5 is placed so as to cover the entire inner surface of the groove portion 4a of the sintered body target 4 structured as shown above, and the recess portion 7 is formed by the powder target 5. That is, the powder target 5 is so placed as to form the recess portion 7 and not to completely fill the groove portion 4a. Further, the target 13 structured as shown above, as it is mounted on the target mounting plate 3, is placed at a portion surrounded by the grounding shield 2 in the vacuum chamber 1. In addition, in this first embodiment, such a groove portion 4a exemplifies the powder placement portion. In this case, the position where the powder target 5 is placed is desirably 20 mm or more away from the side face of the grounding shield 2 in a direction along the target surface. This is because if the powder target 5 is placed at a position within 20 mm from the side face of the grounding shield 2, the red-heating reaction is less likely to occur.

An example of the material for forming the sintered body target 4 as shown above is ITO (Indium Tin Oxide), and an example of the material for the powder target 5 is a powder material formed by mixing indium oxide and tin oxide at the same composition ratio as that of ITO. In particular, the powder material for forming the powder target 5 is preferably the same material as that for forming the sintered body target 4. The reason of this is that when the powder material forming the powder target 5 and the material forming the sintered body target 4 are different from each other, not only the powder target 5 but also the sintered body target 4 becomes a target for film deposition with the result that materials other than the aimed material are mixed into the sputter particles.

Now with regard to the target 13 having a disc shape with a diameter of 300 mm and a thickness of 6 mm, the thickness of a bottom portion in the recess portion 7 formed by the powder target 5 shown in FIG. 2, i.e., the thickness of the powder target 5 from the bottom is assumed to be 2 mm. Deposition process for the base material was performed in two cases where the target 13 of the first embodiment with the recess portion formed therein as shown above was used (sintered body target+powder target, with recess portion) and where a target with no such recess portion formed therein according to a comparative example to the invention (i.e., of the conventional example) was used (conventional target, without recess portion). Under conditions for the film deposition including a plasma source power of 1000 W, an argon gas flow rate of 100 sccm, a pressure of 0.35 Pa, a deposition time of 60 minutes and a distance between target and base material of 100 mm, film deposition was carried out on a on a 160 mm square glass as a base material. In addition, in this first embodiment, the heat conductivity of the target mounting plate 3 is 0.003 cal/cm·sec·° C. and the heat conductivity of the powder target 5 is 0.012 cal/cm·sec·° C.

Figure 3:
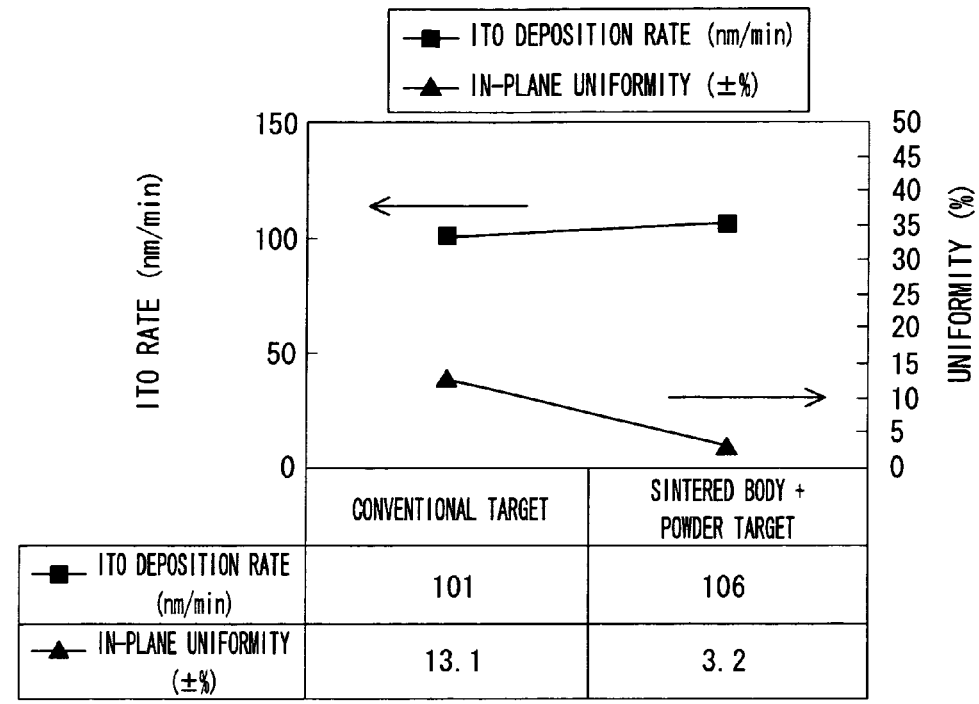
FIG. 3 is a graph showing comparison results in ITO deposition rate and its in-plane uniformity between the target of the first embodiment and a target of a comparative example.

FIG. 3 is a chart showing comparisons in ITO deposition rate (nm/min) 10 minutes after the start of discharge and the in-plane uniformity (±%) of the deposition rate between the two cases where the sintered body target 4 and the powder target 5 were used as in the first embodiment and where the conventional target was used. From a comparison in FIG. 3 between the case where the target 13 of the first embodiment (sintered body+powder target, with recess portion) and the other case where the conventional target (without recess portion) according to the comparative example was used, the deposition rate is 100 nm/min in both cases. Therefore, it can be said that there is no determinately large difference in deposition rate between those cases. On the other hand, the in-plane uniformity measured at 9 points in the plane (with a 150 mm overall length) of the base material was ±13.1% in the case of the conventional target, while the in-plane uniformity was ±3.2% in the case where the sintered body target and the powder target were used as in the first embodiment, showing a considerable improvement.

Figure 4:
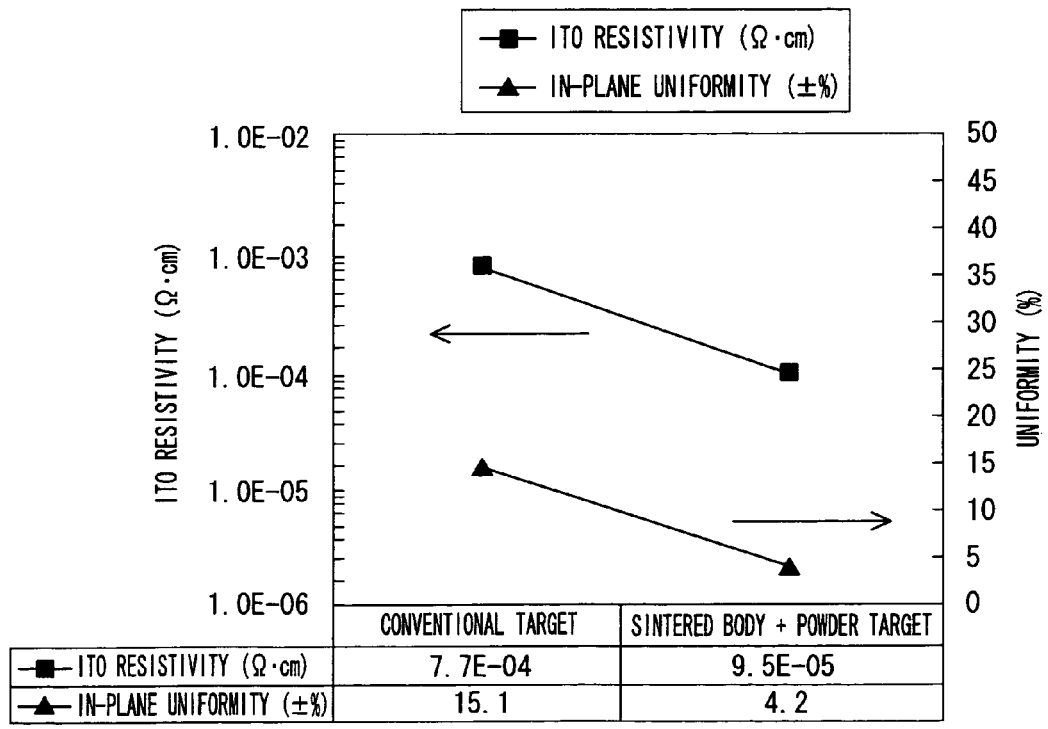
FIG. 4 is a graph showing comparison results in ITO resistivity and its in-plane uniformity between the target of the first embodiment and the target of the comparative example.

Further, FIG. 4 shows measurement results in film resistivity (ITO resistivity, Ω·cm) and its in-plane uniformity obtained by deposition processes using the respective targets. As shown in FIG. 4, the resistivity of the film obtained by using the target 13 of the first embodiment was $9.5 \times 10^{-5}$ Ω·cm on average, while that of the conventional target was $7.7 \times 10^{-4}$ Ω·cm. The in-plane uniformity of resistivity measured at 9 points in the plane (with a 150 mm overall length) of the base material was ±15.1% in the case where the conventional target was used, while the in-plane uniformity greatly improved to ±4.2% in the case where the target 13 of the first embodiment was used. Thus, it can be understood that a film obtained with the use of the target 13, which is composed of the sintered body target 4 and the powder target 5 having the recess portion 7 formed therein as in the first embodiment, is an ITO film superior in electrical characteristics.

Now the mechanism in which sputtering is carried out with the use of the target 13 of the first embodiment is explained below with attention paid to the recess portion 7 formed mainly by the powder target 5. For the following description, partly enlarged schematic explanatory views of a vicinity of the recess portion 7 in the target 13 are shown in FIGS. 5A, 5B, 5C and 5D.

Figure 5A:
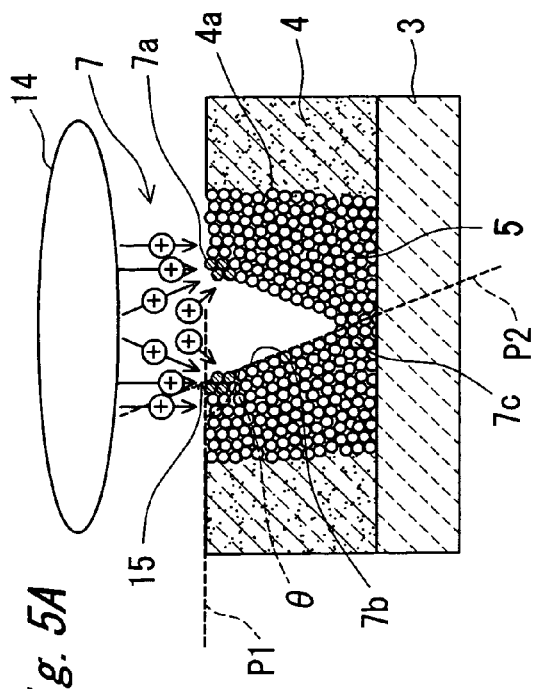
FIGS. 5A to 5D are schematic explanatory views of a vicinity of a recess portion for explaining a mechanism in which sputtering is carried out with the target of the first embodiment, where

In the state that the base material 11 and the target 13 are set in the deposition apparatus 20 and a specified gas is supplied into the vacuum chamber 1 so that a vacuum atmosphere has been formed, the deposition process is started. Then, first, as shown in FIG. 5A, plasma 14 impinges on an edge portion 7a, which is a verge portion of the recess portion 7 of the powder target 5, and red-heating starts at this edge portion 7a. It is noted here that the term, red-heating, refers to a phenomenon that with energy imparted to a target material and the energy accumulated, the target material locally goes a high energy state, emitting light in red or orange or other colors.

Figure 5B:
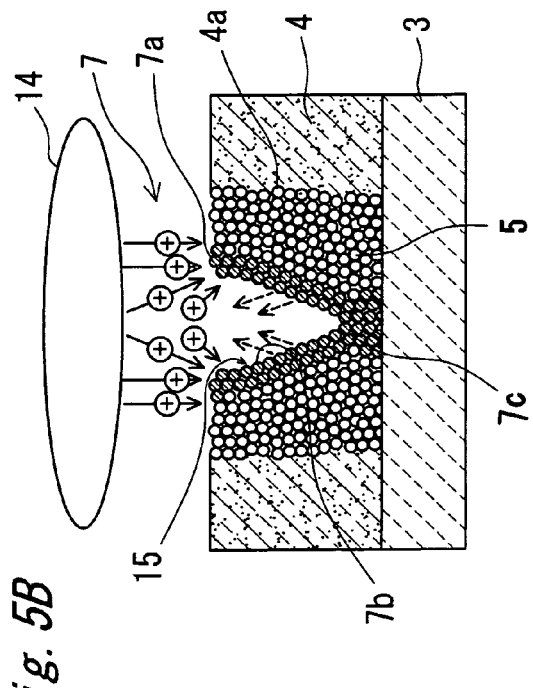
Figure 5C:
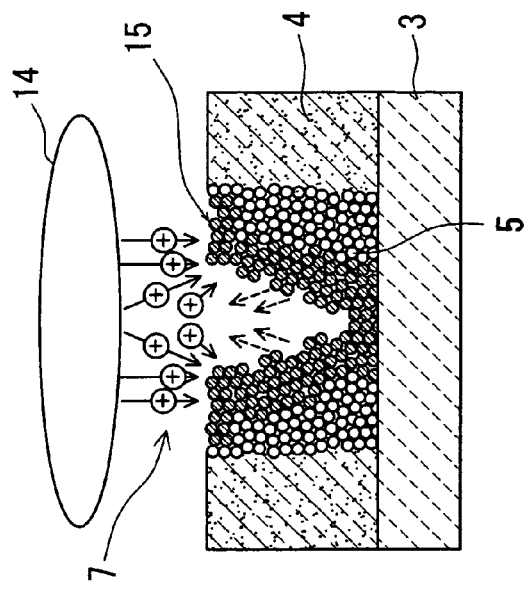
Figure 5D:
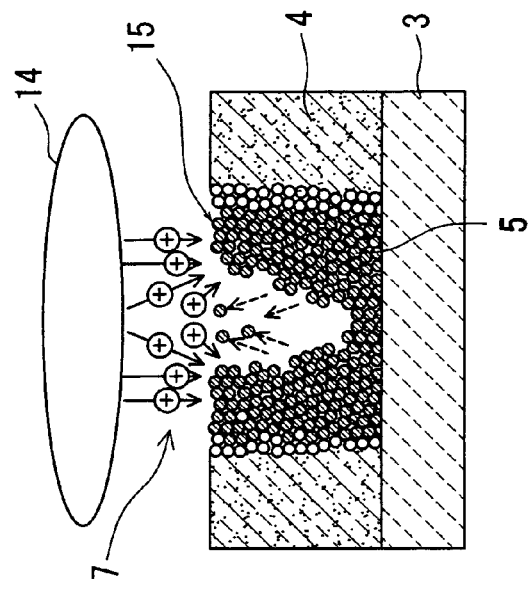

Subsequently, as shown in FIG. 5B, the red-heating is expanded from the edge portion 7a to a bottom portion 7c of the recess portion 7 along a slope 7b of the recess portion 7. The powder target 5, although formed of the same material composition as the sintered body target 4, yet is lower in heat conductivity because of its powder state, as compared with the bulk sintered body target 4. Also, since the powder target 5 is placed so as to be surrounded by the sintered body target 4 as shown above and the target mounting plate 3 of high heat insulation, the red-heated portions 15 of the powder target 5 are interrupted by their boundaries with the powder target 5, thus concentrating on vicinities of the recess portion 7. That is, concentration of the plasma 14 on the edge portion 7a of the recess portion 7 causes energy to be concentratedly imparted to the recess portion 7, where the energy is resultantly accumulated on the powder target 5, which is higher in heat accumulatability as compared with the sintered body target 4, with the result that the red-heated portions 15 are concentrated to vicinities of the recess portion 7. Meanwhile, in the sintered body target 4 to be placed around the recess portion 7, by virtue of its higher heat conductivity than that of the powder target 5, the imparted energy is less likely accumulated, so that red-heated portions do not occur. Therefore, as time elapses, the red-heated portions 15 generated in the recess portion 7 as a result of the concentrated impartment of a plasma to the edge portion 7a are expanded in range as shown in FIG. 5C, with the result that the red-heated portions 15 concentrated more noticeably in the vicinities of the recess portion 7 are formed in the powder target 5 as shown in FIG. 5D. Sputter particles are accelerated from the surfaces of the red-heated portions 15 formed as shown above, being directed toward the base material 11. By virtue of the structure that the target 13 is composed of the sintered body target 4 and the powder target 5 having the recess portion 7 formed therein as shown above, the red-heated portions 15 can be made to occur only at the recess portion 7. Thus, places of occurrence of the red-heated portions 15, which are the generation source for sputter particles, in the target 13 can be controlled reliably. As a result, it becomes possible to control the places of occurrence of sputter particles to thereby stabilize the deposition rate.

In consideration of such a mechanism of the chain of occurrence of the red-heated portions 15 in the recess portion 7 as described above, the control unit 21 included in the deposition apparatus 20 can be said to be a unit for controlling the individual constituent sections for execution of the deposition process, such as the power supply unit 10, in such a fashion that the edge portion 7a of the recess portion 7 is first red-heated, thereafter the red-heated portions are expanded along the surface of the recess portion 7, and then the red-heated portions 15 are formed over the whole recess portion 7.

Figure 6:
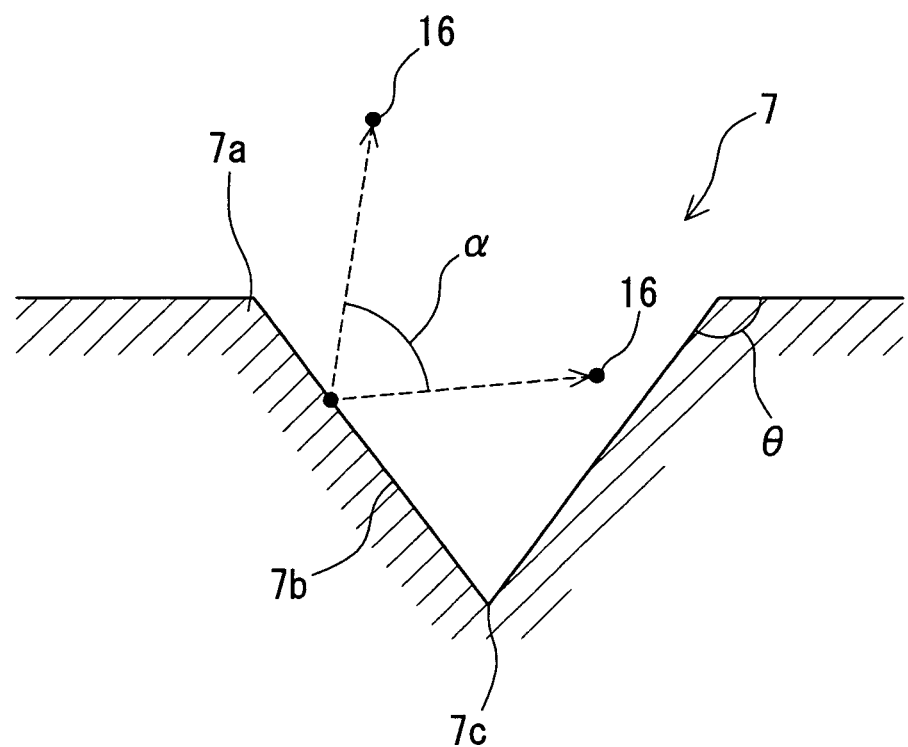
FIG. 6 is a schematic explanatory view for explaining the shape of a recess portion of the target of the first embodiment.

Here is explained a cross-sectional configuration of the recess portion 7 with reference to the schematic explanatory view of the recess portion 7 shown in FIG. 6. Consideration is given to a recess portion 7 which is formed so as to have, for example, a V-shaped cross-sectional configuration as shown in FIG. 6. As a result of the formation of the red-heated portions 15 at the recess portion 7, the powder target 5 flies out over a range of a specified angle α as sputter particles 16. Accordingly, from the left-hand slope 7b in the recess portion 7 of FIG. 6, part of the sputter particles 16 that have flown out over the range of the angle α are interrupted by the opposing right-hand slope 7b. As the ratio of interrupted sputter particles 16 in the recess portion 7 as shown above increases, the use efficiency of the target material decreases, undesirably. Thus, the edge angle θ of the edge portion 7a of the recess portion 7 is preferably set as large as possible from the viewpoint of improving the use efficiency of the target material. In particular, since smaller than 90-degree edge angles θ would cause the amount of interrupted sputter particles 16 to become too large, the edge angle θ is preferably set at least 90 degrees or more. Meanwhile, the more the edge angle θ approaches 180 degrees, the more the edge portion 7a becomes non-present as an edge, making it impossible to cause the plasma concentration. From such a point of view, the edge angle θ needs to be under the limitation that allows the plasma concentration to occur. Thus, from these points of view, the edge angle θ is preferably set to about 120 degrees as an example. In addition, the term "edge angle θ" refers to an angle formed by the side face 7b, which is an inner side face of the recess portion 7, and the surface of the target 13. Also, since such a recess portion 7 is formed by the powder target 5, the side face 7b of the recess portion 7 refers to, for example, a plane P2 defined by a mean value of its surface roughness as shown in FIG. 5A, and the surface of the target 13 refers to a plane P1 defined by a mean value of its surface roughness likewise. Accordingly, the formed angle refers to an angle at which the plane P1 and the plane P2 intersect each other in FIG. 5A.

Figure 7:
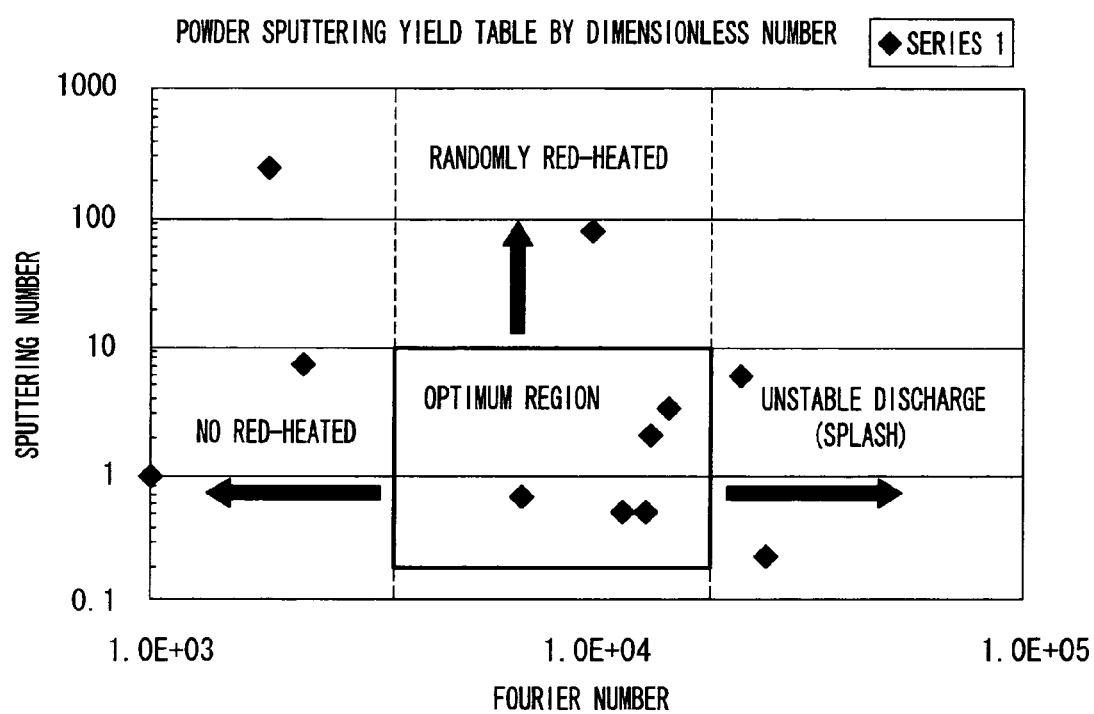
FIG. 7 is a powder sputtering yield table by dimensionless number showing sputtering number and Fourier number in the deposition process using the target of the first embodiment.

Further, experiment results of deposition process performed by using the above-described target 13 of the first embodiment are shown in FIG. 7. FIG. 7 is a double logarithmic chart in which the vertical axis represents the sputtering number and the horizontal axis represents Fourier number. For the powder target of the first embodiment, the heat conductivity is expressed by 'λ', the stabilization time until the deposition process is stabilized is by 't', the specific heat is by 'Cp', the particle size is by 'D', the depth of the recess portion is by 'L', the powder density is by 'ρ', and the specific surface area is by 'S'. It is noted here that the specific surface area refers to a value determined by, for example, BET Method.

As shown in FIG. 7, it can be understood that red heat does not occur with Fourier number smaller than $3.5e^{+03}$ because of lowered heat accumulatability while flying powder occurs to the powder material with Fourier number larger than $2.0e^{+04}$, resulting in unstable discharge. Also, the red-heated portions occur at random with the sputtering number larger than 10, making it difficult to exert control on the deposition rate.

From the results shown above, it can be understood that the following Equation (1) and Equation (2) have to be satisfied in order to stably control the deposition rate:

$$3.5 \times e^{+03} \leq \lambda \cdot t / Cp \cdot \rho \cdot L^2 \leq 2.0 \times e^{+04} \quad (1)$$

$$0.1 \leq D \cdot \rho \cdot S \leq 10 \quad (2)$$

As shown above, it can be understood that a large effect can be obtained in this first embodiment. The mechanism for this is further discussed below.

As to the reason of this, it is considered that controlling the Fourier number having a similarity to the heat conductivity contributes to stable control of the deposition rate in terms of the relationship between deposition rate and heat conductivity obtained by the present invention.

From the viewpoint of deposition rate, the deposition rate improves more and more as the particle size becomes smaller, the powder density becomes smaller and the specific surface area becomes larger.

With a sintered body target of ITO having a thickness of 6 mm used as the target material, a groove portion having a groove depth of 5 mm is formed in the sintered body target, and at the resulting portion, the powder target is placed. After the surface is flattened, such a recess portion is formed that the thickness of the powder target at the bottom portion of the recess portion becomes 2 mm. By such formation, red heating is started at the recess portion simultaneously with the start of discharge, and the red heating gradually expands to the entirety of the powder target, i.e. the entirety of the recess portion. However, the sintered body target therearound is not red-heated, and its in-plane uniformity of deposition keeps successful even with prolonged discharge. In contrast to this, with a target which is formed entirely of powder material without using any sintered body target and which has no recess portion, as in the case of the conventional target of the foregoing comparative example, it is considered that the red heating rapidly expands in the target in a 10-minute elapse after the start of discharge such that the red heat expands all over the target, making it impossible to control regions of occurrence of red-heated portions, with the result of deteriorated in-plane uniformity of film deposition.

For the target of the first embodiment, the mechanism in which using the sintered body target allows red-heated regions to be controlled can be explained as follows.

The powder target is smaller in specific heat and besides smaller in heat capacity than the sintered body target. Therefore, in particular, the edge portion in the recess portion of the powder target increases in temperature, causing the red heat to occur. Thereafter, in the recess portion, the red-heated portions are expanded about the surface of the recess portion. With the use of a material having good heat insulation property for the target mounting plate, temperature increase particularly in the recess portion is accelerated, so that the target material is activated by the heat, thus the sputtering effect being accelerated. Thereafter, as the thermal conduction goes on, the red-heated portions are further expanded to around the recess portion, in which case the red heat can be prevented from expanding to around the recess portion by placing the sintered body target around the recess portion. The reason of this can be considered that because the sintered body target is larger in heat conductivity than the powder target, thermal diffusion is accelerated. Therefore, it can be considered that the in-plane uniformity of the deposition can be improved as compared with the conventional target by the arrangement that the recess portion formed of the powder target is placed only at target regions corresponding to portions where desired in-plane uniformity should be ensured in the base material. Thus, by using the target of this first embodiment, the in-plane uniformity of deposition rate and deposited film are improved, so that the rate stability for continuous deposition can also be improved to a large extent.

Figure 8A:
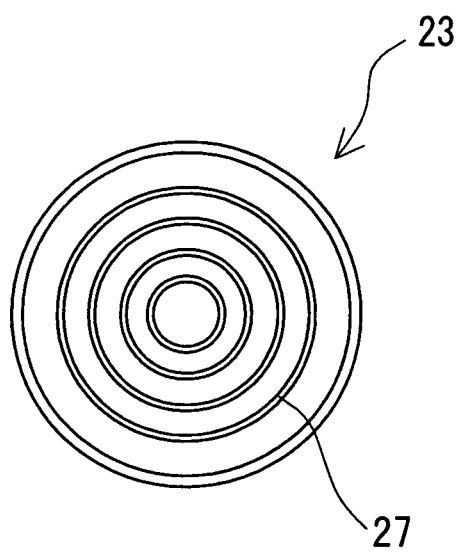
FIG. 8A is a schematic plan view of a target according to a modification example of the first embodiment.
Figure 8B:
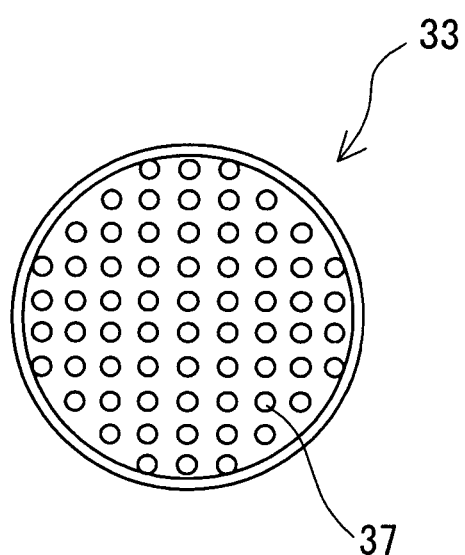
FIG. 8B is a schematic plan view of a target according to another modification example.
Figure 8C:
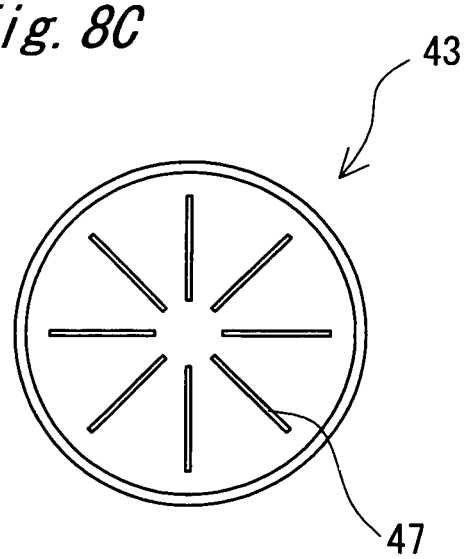
FIG. 8C is a schematic plan view of a target according to still another modification example.

Further, as shown in the schematic plan views of FIGS. 8A, 8B and 8C, various modes are adoptable as planar placement of the recess portion 7 formed in the target 13 or the groove portion 4a formed in the sintered body target 4 in this first embodiment. More specifically, in a case where one or a plurality of doughnut-shaped recesses portions 27 are formed as in a target 23 shown in FIG. 8A, or in a case where radial-shaped recess portions 47 are formed as in a target 43 shown in FIG. 8C, since the recesses portions 27, 47 are point symmetrical with respect to a center of a plane on which the target is mounted, the sputter particles flying toward the base material 11 also become point symmetrical so as to be sputtered evenly, allowing the deposition to progress with high precision. Also, the case may be that a multiplicity of recess portions 37 having a circular or square shape as seen in a plan view are placed in an array shape, like a target 33 shown in FIG. 8B. Otherwise, although not shown, a plurality of linear-shaped recess portions may be laid out in a stripe shape. In addition, when the target is machined by using tools, the doughnut-shaped recess portion of FIG. 8A, which can be machined by one-time action, is easier to machine than the radial-shaped recess portions of FIG. 8C. Moreover, in the case of a target that is not formed in point symmetry, it is also possible to ensure the in-plane uniformity of deposition by, for example, performing the deposition process while the target mounting plate 3 is being rotated.

Further, these recess portions 7 may be provided one in number. If the recess portions 7 are provided two or more in number, equal distances between the recess portions are preferred because the deposition can be carried out more uniformly.

Further, in the first embodiment, regions of thinner target thickness as compared with the other regions, i.e., the regions where the recess portions 7 are formed are preferably set in a ratio of 50% or less to the surface area of the whole target. This is because 50% or more formation regions for the recess portions 7 would cause red-heated portions to occur at random within the formation regions of the recess portions 7, making it difficult to control the red-heated portions.

Further, in the case where a plurality of recess portions are to be formed, the respective recess portions may be laid out so as to cross one another. In such a case, however, it is necessary to give thought to differences in deposition conditions between crossing portions and other portions.

Further, the target material may be contained from among typical metal elements or transition metal elements, or oxides, fluorides, nitrides, hydroxides, carbonates or sulfides of those metal elements. In particular, when any of oxides, fluorides, nitrides, hydroxides, carbonates or sulfides of the metal elements is used as the target material, the working effects of the first embodiment can be obtained effectively.

Further, the thickness of the target material in the recess portion 7 formed in the target 13, i.e. thickness of the bottom portion of the recess portion 7, has to be at least more than 0 mm. That is, it is indispensable that the target material be present at the bottom portion of the recess portion 7 without exposure of the surface of the target mounting plate 3. This is because with the thickness of the target material equal to 0 mm, red heat no longer occurs to the bottom portion. If the thickness of the target material in the recess portion 7 becomes larger than 5 mm, thermal diffusion among powder particles of the target material becomes more active, causing the heat insulation property, i.e. heat accumulatability, to lower, so that red-heated portions are less likely to occur to the powder target 5. Therefore, the thickness of the target material in the recess portion 7 is desirably not more than 5 mm.

Further, the depth of the recess portion 7 formed in the target 13 is desirably not less than 1 mm. It can be considered that if the depth of the recess portion 7 becomes 1 mm or lower, the powder target is subject to more active thermal conduction, causing the heat insulation property to lower, so that red heat become less likely to occur.

Further, the step of forming the recess portion 7 in the target 13 may be done either before or after evacuation of the vacuum chamber 1. In addition, when the recess portion 7 is formed before the evacuation, there is a need for considering any effects of the evacuation on the recess portion 7.

Further, on the assumption that the radius of the disc-shaped target is 150 mm, it would be proper that the distance from a center of the disc-shaped target to regions where the powder target 5 is formed is about 75 mm. As to the reason of this, it is considered that too close positions of placement of the powder target 5 would cause sputter particles having flown out from the powder target 5 to interfere with one another, resulting in nonuniform deposition rates.

Further, although values vary depending on various conditions, it is desirable that if a value of 75 mm is proper as the distance from the center of the disc-shaped target to the powder target 5 under the condition of electric power of 2 kW applied to the target 13, the distance from the center of the disc-shaped target to the powder target 5 is about 375 mm when the electric power applied to the target 13 is 50 kW. This is because the fly-out of sputter particles is considered as depending on the magnitude of the electric power applied to the target.

Further, the width of the recess portion 7 is desirably not more than 20 mm. This is because larger than 20 mm widths of the recess portion 7 would cause the cross-sectional configuration within the recess portion 7 to become unstable, resulting in unstable fly-out state of the sputter particles from the recess portion 7.

The above first embodiment has been described with the use of the vacuum plasma apparatus. However, it is considered that using the target of the above first embodiment make it possible to obtain the same working effects even in an atmospheric plasma in which the internal pressure of the chamber is 1013 hPa.

Further, in the first embodiment, a target obtained by subjecting the powder target 5 to a heating process for 3 hours at 200° C. is used. The reason of this is that because the powder material constituting the powder target 5 is highly adsorptive for moisture or other impurities, adsorbed moisture is removed by performing the heating process with the aim of enhancing the purity of the resulting film. Such a heating process may be carried out, for example, for 10 minutes or more at 100° C. or more. This is because less than 100° C. temperatures would make it hard to obtain the effect of moisture volatilization, and less than 10 minutes time durations would make it hard to obtain the effect on the whole powder target.

Further, in the first embodiment, the powder target 5 used has a particle size of 0.2 μm. However, such a powder target needs only to have a maximum particle size of 1 μm or less. This is because powder having a maximum particle size of more than 1 μm, if used as the powder target, would cause a poor heat insulation property among powder particles as well as a large heat capacity, making red heat less likely to occur.

Further, in the first embodiment, quartz is used for the target mounting plate 3. Otherwise, ceramic materials having high temperature resistance such as aluminum oxide, zirconium oxide, and oxide silicon may be used.

Further, in the first embodiment, argon gas is used as the process gas for use in deposition. However, at least one among argon, oxygen, hydrogen, and nitrogen may be used therefor.

Further, in the first embodiment, a sputtering method is selected in terms of composition control and apparatus operability. However, other deposition methods may be used only if the method allows the target to heat red. Any deposition method such as evaporation methods or laser-using methods are usable.

Further, since the powder target decreases on and on with progress of the deposition process, it is desirable to additionally provide a material feed mechanism for the powder target within the vacuum chamber 1. This material feed mechanism may be, for example, a unit for calculating a decrement from the total amount of the target by integrating deposition rate and deposition time and executing target material feed in response to the calculated remaining amount. Besides, if the material feed mechanism is equipped with feed tank and feed nozzle, a flattening mechanism and a groove formation head, then it becomes implementable to flatten the material and thereafter form the groove. The groove formation head, as in the case of the foregoing recess portion formation member, is to form the recess portion by partly pressurizing or removing the powder target 5.

Further, relatively rotating the target 13 and the base material to each other allows uniform deposition processing to be achieved even if the recess portion 7 is not formed in point symmetry about the center of the target 13.

Further, it is desirable to place a magnet under the target. This is because such an erosion that electron density becomes the highest, when formed at or around the recess portion of the target, contributes to improvement in the deposition rate.

(Second Embodiment)

The present invention may be carried out in other various modes without being limited to the above embodiment. For example, FIG. 9 is a schematic sectional view showing the structure of a target 113 which is an example of the deposition target to be used in the deposition apparatus according to a second embodiment of the invention.

Figure 9:
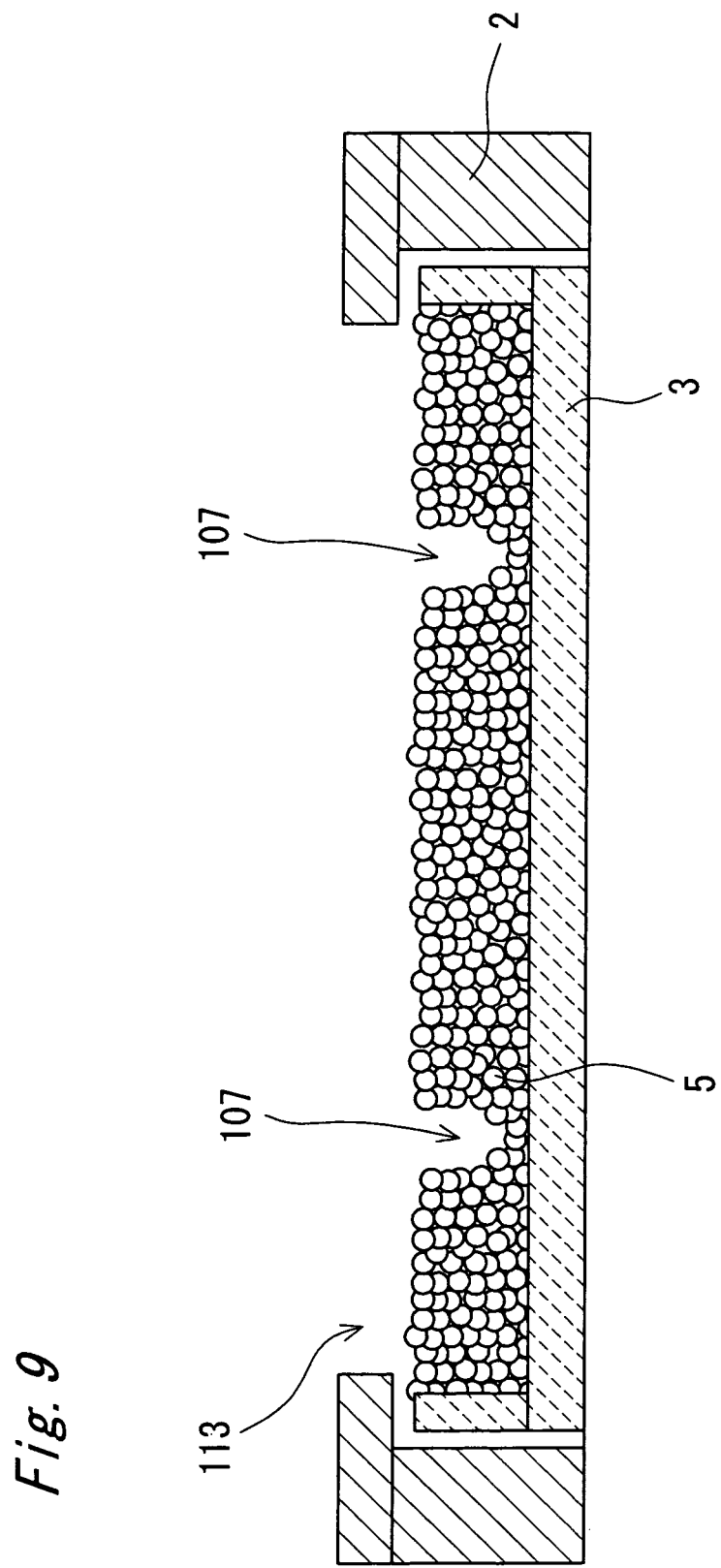
FIG. 9 is a schematic sectional view showing the structure of a target according to a second embodiment of the invention.
Figure 10:
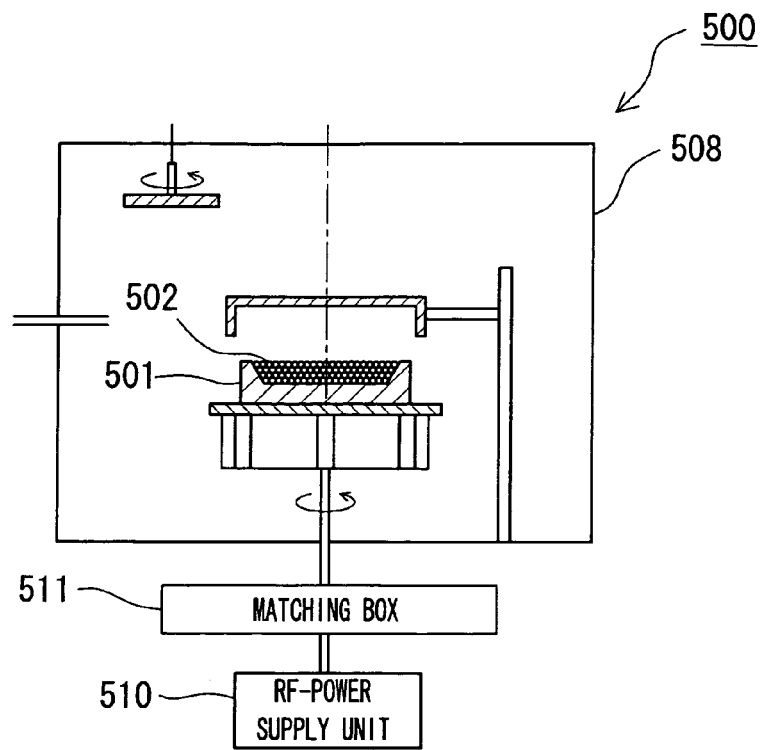
FIG. 10 is a schematic view showing the conventional sputtering apparatus disclosed in Document 1.
Figure 11:
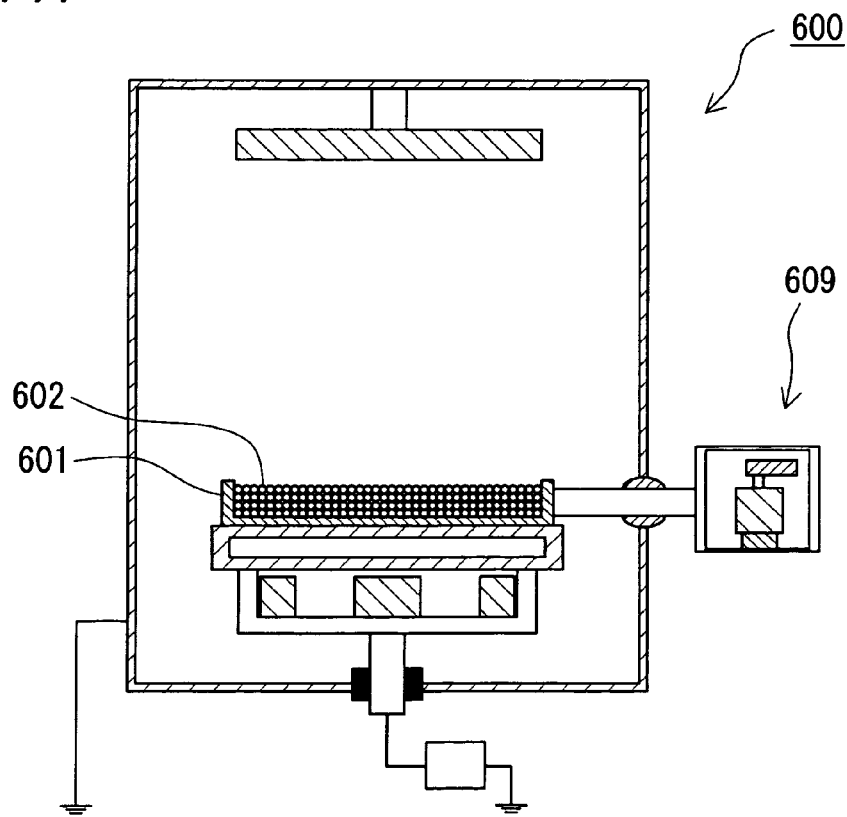
FIG. 11 is a schematic view showing the conventional optical thin film manufacturing apparatus disclosed in Document 2.
Figure 12:
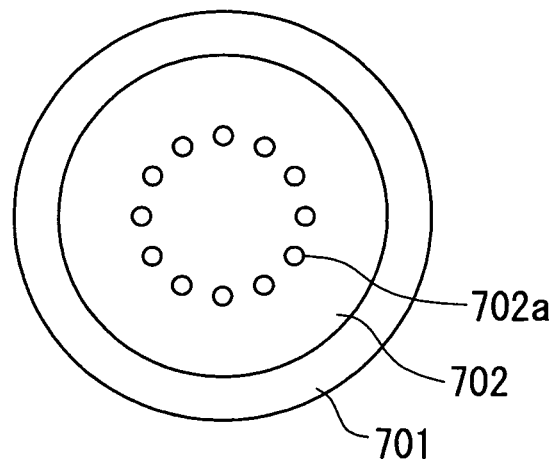
FIG. 12 is a schematic view showing a target to be used in the conventional reactive sputtering apparatus disclosed in Document 3.
Figure 13A:
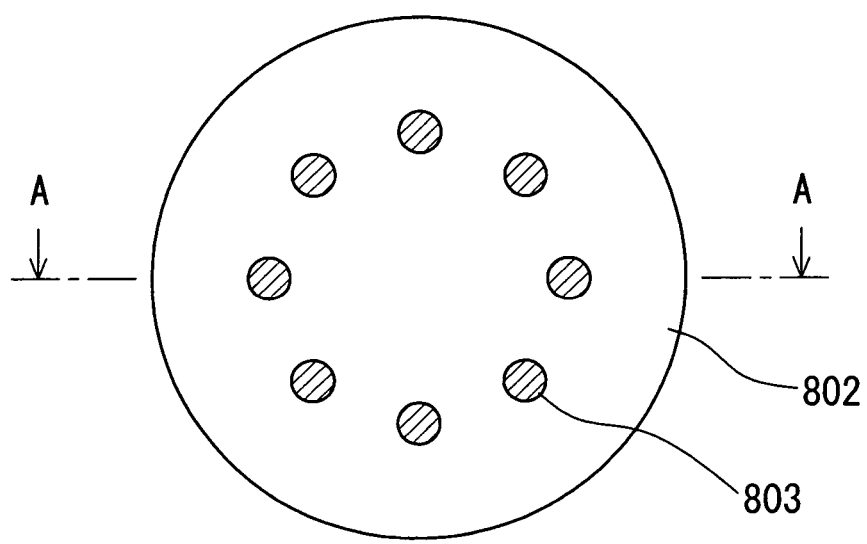
FIG. 13A is a view showing the conventional complex target disclosed in Document 4.
Figure 13B:
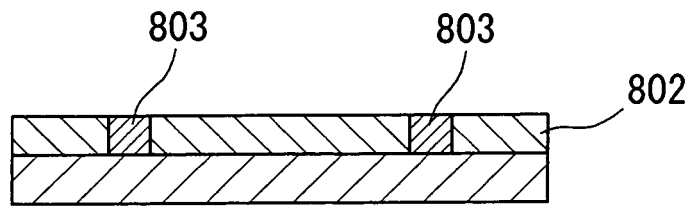
FIG. 13B is a sectional view of the conventional target of FIG. 13A taken along the line A-A.

As shown in FIG. 9, the target 113 of this second embodiment differs from the target 13 of the foregoing first embodiment in that the powder target 5 alone is mounted on the target mounting plate 3 in the deposition apparatus without the sintered body target being mounted thereon. Also, as shown in FIG. 9, in the state that the powder target 5 is mounted on the target mounting plate 3, recess portions 107 are formed by the powder target 5.

Such recess portions 107 can be formed by, for example, placing and filling the powder target 5 all over the target mounting plate 3 and then stamping the powder target 5 with a stamper corresponding to the configuration of the recess portions or scraping off the surface of the powder target or the like.

Even with such a target 113, which is formed of the powder target 5 alone, it is also possible to exert control so that red-heated portions are generated in vicinities of the recess portions 107, where working effects similar to those of the first embodiment can also be obtained. It is noted, however, that the target of the first embodiment, which is composed of the sintered body target and the powder target, is preferable from the viewpoint that regions where the powder target is placed are surrounded by the sintered body target for more restriction of the regions where red-heated portions are generated, as well as from the viewpoint of the feedability of powder material to the target for repeated execution of deposition process. In view of these points, similar effects can be obtained even if partition walls having such heat insulation property as does not affect the sputtering are provided instead of the sintered body target.

Figure 14:
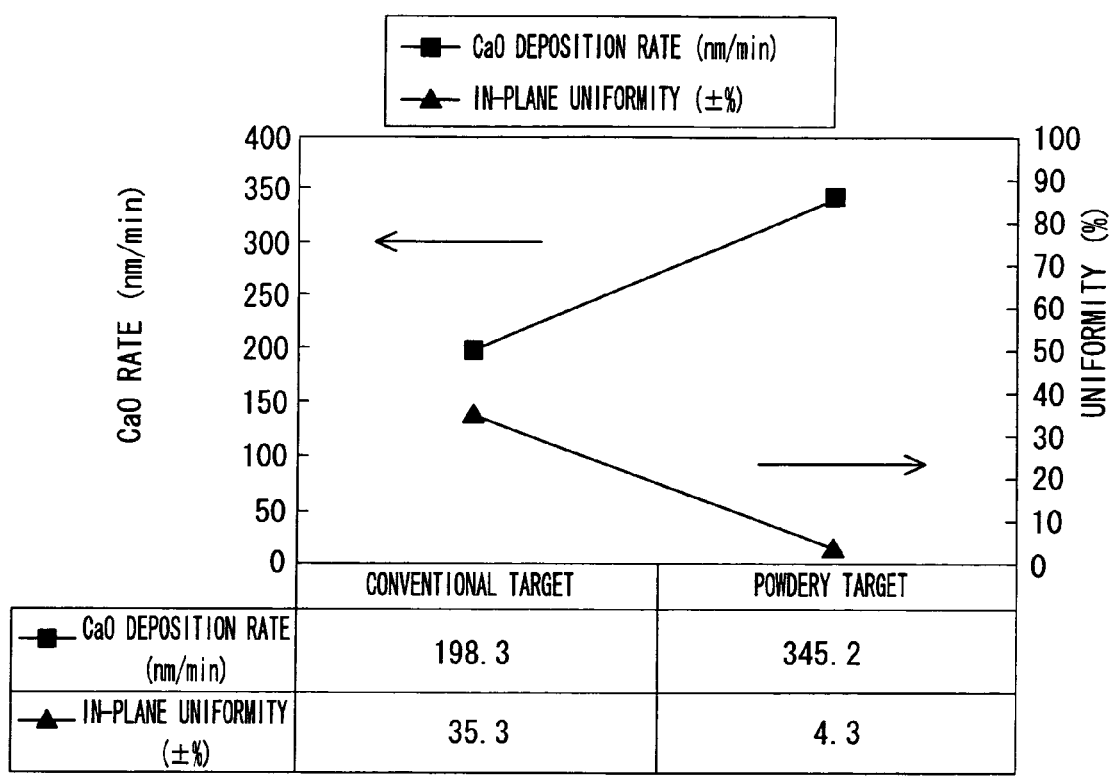
FIG. 14 is a graph showing comparison results in CaO deposition rate and its in-plane uniformity between the target of the second embodiment and the target of the comparative example.

FIG. 14 shows measurement results of performing deposition process on a base material under the condition that calcium oxide was laid down uniformly as the target material of the recess portion 7 in the target 113, which was composed of the powder target 5 alone, in two cases where a film was deposited under the same conditions as in the foregoing first embodiment (powder target, with recess portion) and where a target according to the comparative example to the invention (conventional target, without recess portion). Referring to FIG. 14, the CaO rate obtained with the use of the target of the second embodiment (powder target, with recess portion) was 345.2 nm/min, while it was 198.3 nm/min with the conventional target. As a result of this, it can be understood that deposition process of superior deposition rate can be implemented in the case where a powder target which is an alkaline-earth oxide is used as in this second embodiment.

Although the foregoing embodiments have been described on a case where the whole recess portion is formed of a powder target in the target, yet it is also possible, instead of such a case, to adopt a structure that the sintered body target is exposed only at the bottom portion of the recess portion. Exposure of other than the target material at the bottom portion of the recess portion is not preferable in terms of control of the red-heated portions, but it can be considered that the structure that the sintered body target is exposed only from the bottom portion does not have a significant influence on the occurrence of the red-heated portions because of a relatively small surface area of the exposure.

In addition, in a case where the target is large such that the red-heated portions occur randomly even with the provision of one recess portion in the embodiments, it would be necessary to provide a plurality of recess portions.

It is to be noted that, by properly combining the arbitrary embodiments of the aforementioned various embodiments, the effects possessed by them can be produced.

The deposition apparatus of the present invention is capable of improving the in-plane uniformity of deposition rate and target and further ensuring mass-production stability of deposition rate. Therefore, the deposition apparatus is applicable to deposition processes for the manufacture of various devices such as displays and cells or semiconductors.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2005-020704 filed on Jan. 28, 2005, No. 2005-166486 filed on Jun. 7, 2005 and No. 2005-310746 filed on Oct. 26, 2005, including specification, drawing and claims are incorporated herein by reference in its entirety.

What is claimed is:

1. A deposition method by PVD, comprising:
applying electric power to a target in a processing chamber such that a plasma is generated within the processing chamber; and
generating sputter particles from the target with the plasma such that the sputter particles form a deposition film on a base material,
wherein the target has a recess portion, a surface of the recess portion being formed of a powder material,
wherein the recess portion has a depth of at least 1 mm, and
wherein said generating sputter particles from the target includes impinging the plasma on the powder material.

2. The deposition method by PVD as defined in claim 1, wherein a width of the recess portion in the target is not more than 20 mm.

3. The deposition method by PVD as defined in claim 1, wherein one or a plurality of the recess portions are placed in point symmetry with respect to a center of the target.

4. The deposition method by PVD as defined in claim 1, wherein the powder material has a particle size of not more than 1 μm.

5. The deposition method by PVD as defined in claim 1, further comprising:
before impinging the plasma on the powder material, providing the target having the recess portion with the surface of the recess portion being recessed from a top surface of the target and with the surface being formed in the powder material.

6. The deposition method of claim 1, wherein the target includes a top surface that is substantially planar, and wherein an angle formed between the top surface of the target and the surface of the recess portion is less than 180 degrees and not less than 90 degrees.

7. The deposition method by PVD as defined in claim 1, wherein the powder material has a heat conductivity $\lambda$, a stabilization time $t$, a specific heat conductivity $Cp$, a powder density $\rho$, and a depth $L$ of the recess portion, and wherein a Fourier number defined by $((\lambda \cdot t)/(Cp \cdot \rho \cdot L^2))$ has a value of at least $3.5 \times e^{+03}$ and not more than $2.0 \times e^{+04}$.

8. The deposition method by PVD as defined in claim 1, wherein the powder material has a particle size D, a powder density $\rho$, and a specific surface area S, and wherein a value defined by $D \cdot \rho \cdot S$ is at least 0.1 and not more than 10.

9. A deposition target for use in PVD, comprising:
a sintered body target in which a powder-material placement portion is formed; and
a target surface having a recess portion formed therein, a surface of the recess portion being formed of a powder material,
wherein the powder material is placed in the powder-material placement portion so that the recess portion is formed in the powder material,
wherein the powder-material placement portion is shaped as a recess or a through hole, and
wherein the recess portion has a depth of at least 1 mm.

10. The deposition target for use in PVD as defined in claim 9, wherein one or a plurality of the recess portions are placed in point symmetry with respect to a center of the target.

11. The deposition target of claim 9, wherein the target surface is substantially planar, and wherein an angle formed between the target surface and the surface of the recess portion is less than 180 degrees and not less than 90 degrees.

12. The deposition target for use in PVD as defined in claim 11, wherein the recess portion is formed such that the angle is 120 degrees.

13. The deposition target for use in PVD as defined in claim 9, wherein a width of the recess portion is not more than 20 mm.

14. The deposition target for use in PVD as defined in claim 9, wherein the powder material has a particle size of not more than 1 μm.

15. The deposition target for use in PVD as defined in claim 9, wherein the sintered body target has a same composition as the powder material.

16. The deposition target for use in PVD as defined in claim 9, wherein the powder material is made by mixing together two or more different kinds of powder materials.

17. The deposition target for use in PVD as defined in claim 9, wherein the powder material contains typical metal elements or transition metal elements, or oxides, fluorides, nitrides, sulfides, hydroxides or carbonates of the metal elements.

18. The deposition target of claim 9, wherein the powder material is configured to generate sputter particles when plasma is impinged thereon.

19. The deposition method by PVD as defined in claim 9, wherein the powder material has a heat conductivity $\lambda$, a stabilization time t, a specific heat conductivity Cp, a powder density $\rho$, and a depth L of the recess portion, and wherein a Fourier number defined by $((\lambda \cdot t)/(Cp \cdot \rho \cdot L^2))$ has a value of at least $3.5 \times e^{+03}$ and not more than $2.0 \times e^{+04}$.

20. The deposition method by PVD as defined in claim 9, wherein the powder material has a particle size D, a powder density $\rho$, and a specific surface area S, and wherein a value defined by $D \cdot \rho \cdot S$ is at least 0.1 and not more than 10.

* * * * *